United States Patent [19]

Yamaguchi

[11] Patent Number: 4,719,636
[45] Date of Patent: Jan. 12, 1988

[54] WAVELENGTH TUNABLE SEMICONDUCTOR LASER DEVICE PROVIDED WITH CONTROL REGIONS

[75] Inventor: Masayuki Yamaguchi, Tokyo, Japan

[73] Assignee: NEC Corporation, Tokyo, Japan

[21] Appl. No.: 769,048

[22] Filed: Aug. 26, 1985

[30] Foreign Application Priority Data

Aug. 24, 1984 [JP] Japan .................................. 59-176220

[51] Int. Cl.⁴ .............................................. H01S 3/19
[52] U.S. Cl. ........................................ 372/50; 372/20; 372/26; 372/96
[58] Field of Search ........................ 372/26, 96, 50, 20

[56] References Cited

U.S. PATENT DOCUMENTS

| | | | |
|---|---|---|---|
| 4,101,845 | 7/1978 | Russer | 372/50 |
| 4,558,449 | 12/1985 | Gordon | 372/26 |
| 4,608,697 | 8/1986 | Coldren | 372/50 |

OTHER PUBLICATIONS

"Bragg Wavelength-Tunable DBR-DC-PBH LD", (in Japanese), 1984 National Convention (Record) of the Institute of Electronics and Communication Engineers of Japan, Part 4, Paper No. 1022.

Primary Examiner—James W. Davie
Assistant Examiner—Bertha Randolph
Attorney, Agent, or Firm—Sughrue, Mion, Zinn, Macpeak & Seas

[57] ABSTRACT

A semiconductor laser device which oscillates with a single longitudinal mode and has a continuous wavelength tuning capability. The laser comprises an n-InP substrate which is divided into a tuning region, active region and phase control region, each defined by a separate electrically isolated electrode. The InP substrate has a diffraction grating in the tuning region and an active layer in the active region, the active layer having a wavelength composition which causes the emission of light with a single longitudinal mode when a drive current is injected into the active region from the corresponding electrode. Continuous wavelength tuning is provided by injecting concurrently into the semiconductor a tuning current and a phase current through the respective electrodes in a predetermined ratio.

15 Claims, 5 Drawing Figures

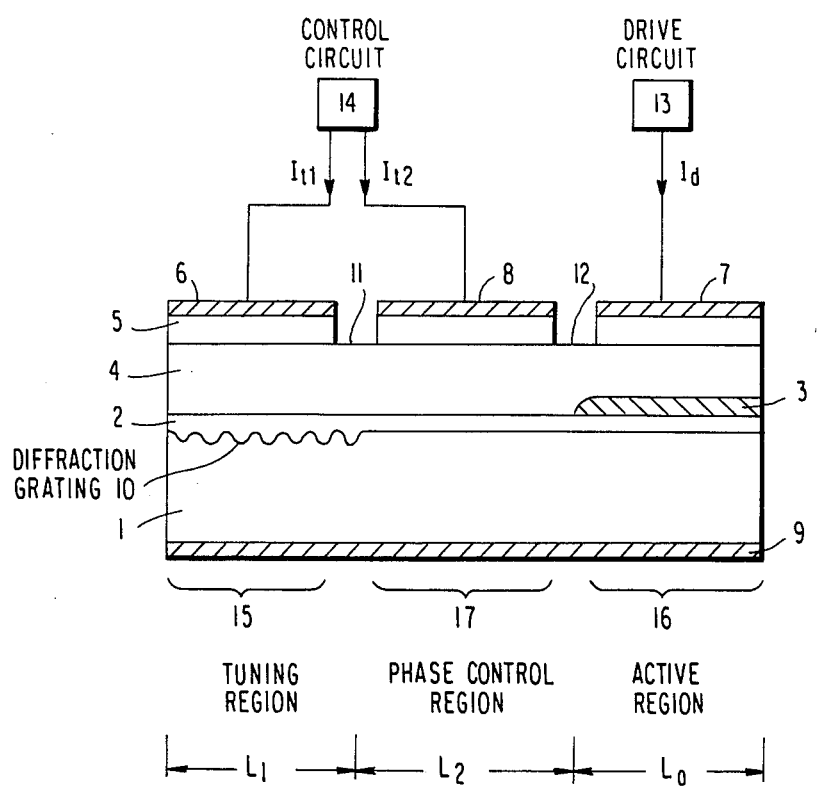

WAVELENGTH TUNABLE SEMICONDUCTOR LASER DEVICE PROVIDED WITH CONTROL REGIONS

BACKGROUND OF THE INVENTION

The present invention relates to a semiconductor laser and, more particularly, to a semiconductor laser device which oscillates with a single longitudinal mode and has a continuous wavelength tuning capability.

As well known in the art, a distributed feedback (DFB) or distributed Bragg reflector (DBR) semiconductor laser oscillates with a stable single longitudinal mode, even during high-speed modulation, utilizing wavelength selectivity of a diffraction grating which is provided in a semiconductor crystal. With such a capability, a DFB or DBR laser is expected to be useful as a light source for future optical coherent transmission systems as well as for long distance, large capacity optical fiber communications. In an optical heterodyne system, which is one of the optical coherent transmission systems, it is a primary requisite that at a receiving station a beat signal having a predetermined frequency be provided by interference between incoming signal light and light which is oscillated by a local oscillation light source, or local oscillator. To meet this requirement, the local oscillator must constantly follow the wavelength of signal light while maintaining a certain predetermined frequency difference. Therefore, a laser which is to serve as a local oscillator needs to oscillate with a single longitudinal mode and, yet, feature wavelength controllability, in particular continuous wavelength controllability.

Wavelength-controllable, or tunable, single-wavelength semiconductor lasers include a DBR laser which was reported in "Bragg Wavelength-Tunable DBR-DC-PBH LD" (in Japanese) 1984 National Convention (Record) of the Institute of Electronics and Communication Engineers of Japan, Part 4, Paper No. 1022. A schematic structure of this tunable DBR laser is shown in FIG. 2. As shown, an active layer 3 having a 1.3 μm wavelength composition and a P-InGaAsP guide layer 2 having a 1.2 μm wavelength composition are sequentially grown on an n-InP substrate 1. A diffraction grating 10 having a period of about 4000 A is provided only in that part 15 of the surface of the guide layer 2 which serves as a tuning region, while that part 16 of the guide layer surface which serves as an active region is left flat. Thereafter, a p-InP cladding layer 4 and a p+-InGaAsP cap layer 5 are sequentially grown on the entire surface of the guide layer 2. Provided above the tuning region 15 and the active region 16 are a tuning electrode 6 and a laser driving electrode 7, respectively. The cap layer 5 is partly removed to define a groove 11 between the electrodes 6 and 7 which insures electrical isolation between the electrodes 6 and 7. An n-electrode 9 is provided on the n-side of the multi-layer semiconductor. The DBR LD having such a structure oscillates with a single longitudinal mode when a drive current $I_d$ is injected into the active region 16, the wavelength being tunable in response to a tuning current $I_t$ injected into the tuning region 15. This is derived from the fact that the current $I_t$ injected into the tuning region 15 increases the carrier density at the tuning region 15 side of the laser and, thereby, lowers the refractive index through the plasma effect. As a result, the Bragg wavelength, which is dependent upon the period of the diffraction grating 10, is shifted toward shorter wavelength. Therefore, injection of the current $I_t$ causes the oscillation wavelength to vary toward shorter wavelength. However, the tuning characteristic particular to this kind of DBR LD involves mode jumping. Specifically, the DBR LD is incapable of performing continuous wavelength tuning, although it is capable of controlling the Bragg wavelength by means of the tuning current $I_t$. The DBR LD cannot control the phase of light which, with the active region 16 viewed from the boundary between it and the tuning region 15, is propagated through the active region 16 and then returned by reflection from the right end of the LD which has an end facet.

SUMMARY OF THE INVENTION

It is therefore an object of the present invention to provide a semiconductor laser device which oscillates with a single longitudinal mode and is capable of continuous wavelength tuning.

A semiconductor laser device of the present invention comprises a multi-layer semiconductor structure including an active region which includes an active layer for emitting light responsive to stimulation, a first control region including a guide layer for guiding light which is being propagated, and a second control region including a guide layer provided with a diffraction grating for guiding light which is being propagated. The active region, first control region and second control region are arranged in a row along an axis of resonance. The device further comprises an active electrode for injecting a current into the active region, a first control electrode and a second control electrode for injecting currents respectively into the first and second control regions, an electric circuit for applying a drive current to the active electrode, and an electric circuit for applying control currents to the first and second control electrodes in a predetermined ratio.

BRIEF DESCRIPTION OF THE DRAWINGS

The above and other objects, features and advantages of the present invention will become more apparent from the following detailed description taken with the accompanying drawings in which:

FIG. 4 is an illustration of an alternative embodiment of the present invention.

PRINCIPLE OF THE INVENTION

To better understand the present invention, the principle of operation of the prior art tunable DBR laser will be described in order to show its tuning characteristic which involves mode jumping.

Figure 2:
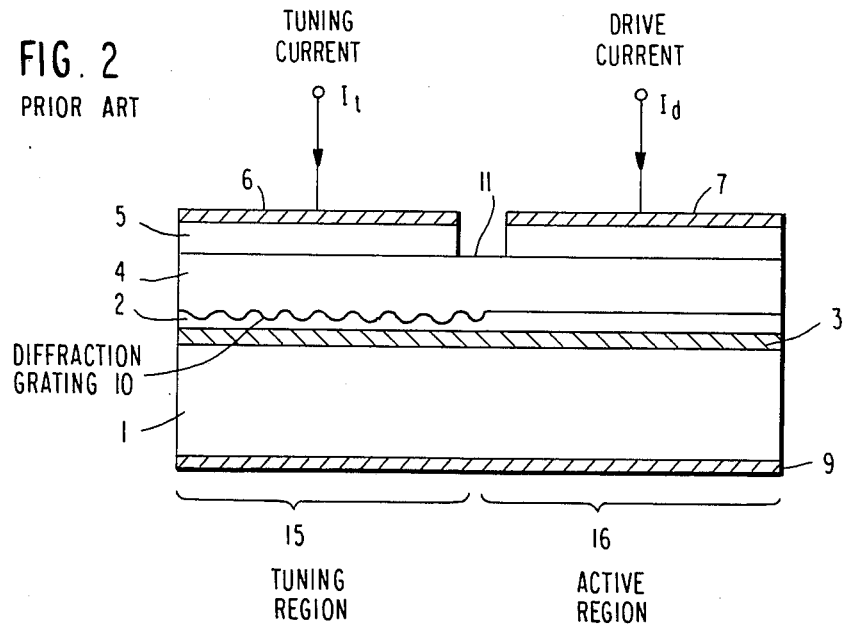
FIG. 2 is a section of a prior art wavelength tunable DBR laser.
Figure 3A:
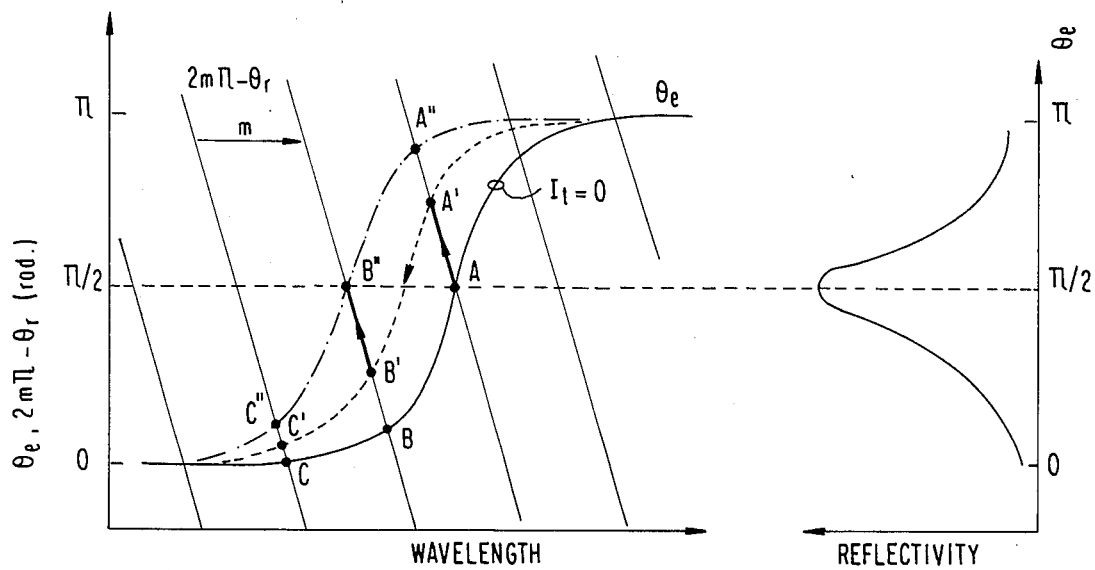
FIG. 3A is a plot useful for explaining the principle of operation of the prior art tunable DBR laser and showing a relationship between wavelengths and phases $\theta_l$ of light which is returned from a tuning region to the bounary between the tuning region and an active region and phases $\theta_\gamma$ of light which is returned from the active region, and a relationship between the phases $\theta_l$ and reflectivity with the tuning region looked into at the boundary.

The phase condition for the element shown in FIG. 2 to oscillate is provided as $\theta_l + \theta_\gamma = 2m\pi$, where $\theta_l$ is a phase of light returned from the tuning region 15 due to reflection, with the tuning region 15 viewed from the boundary between the tuning region 15 and the active region 16, $\theta_\gamma$ is a phase of light returned from the active region 16 as viewed from the boundary, and m is an integer. Assuming that the active region 16 extends over a length L, and that the propagation constant is $\beta$, the phase $\theta_\gamma$ is represented by $\theta_\gamma = -2\beta L$. The wavelength dependency of the phase $\theta_l$ and $(2m\pi - \theta_\gamma)$ is shown at left of FIG. 3A. The phase $\theta_l$ is variable continuously with the amount of current injection into the tuning region 15 as a parameter. The curves indicated by a solid line, broken line and dash-and-dot line indicate the phase response where the amount of current injection is increased from a low to an intermediate to a higher level. Meanwhile, the phase $\theta_\gamma$ is immune to changes in the amount of current injection into the tuning region 15. The above-stated oscillation phase condition are represented by the crossing points of $\theta_l$ and $(2m\pi - \theta_\gamma)$; possible oscillation modes are A, B and C as shown in FIG. 3A. Shown at right of FIG. 3A is the $\theta_l$ dependency of reflectivity with the tuning region 15 looked into from the boundary. The specific wavelength which provides $\theta_l = \pi/2$ coincides with the Bragg wavelength and, under this condition, the reflectivity at the tuning region 15 side becomes maximum. The actual oscillation mode is a mode having the highest reflectivity out of those modes which satisfy the oscillation phase condition. Stated another way, among the modes A, B and C, one whose phase $\theta_l$ is closest to $\pi/2$ oscillates; before the tuning current $I_t$ is applied ($I_t=0$), the mode A will oscillate. Upon injection of the current $I_t$, the Bragg wavelength shifts toward shorter wavelength due to a decrease in refractive index which is derived from the plasma effect, causing the curve representative of $\theta_l$ to shift in parallel toward shorter wavelength. As a result, the mode represented by the crossing point A shifts little by little toward shorter wavelength as A→A'→A'' responsive to the increase in the current $I_t$ while, at the same time, the phase $\theta_l$ of mode A shifts away from $\pi/2$. In contrast, the mode B which neighbors the mode A at the shorter wavelength side varies as B→B'→B'' responsive to the increase in current $I_t$, the phase $\theta_l$ approaching $\pi/2$. It follows that a condition wherein the phase $\theta_l$ of the mode B is closer to $\pi/2$ than that of the mode A occurs at a certain injection level of the current $I_t$, allowing the mode to jump as represented by A'→B' in FIG. 3A. In this manner, in a tunable DBR laser with the prior art structure, mode jumping is repeated as A→B→C responsive to an increase in the current $I_t$ so as to undesirably shift the wavelength toward shorter wavelength.

In order to accomplish continuous wavelength tuning which is free from mode jumping, the present invention provides a structure in which the phase $\theta_\gamma$ of reflection is controllable at the end of the laser on the active region 16 side. Specifically, a phase control region which utilizes variations of refractive index due to the plasma effect is added next to the active region 16, so that $\theta_\gamma$ may be intentionally controlled by injecting a phase control current into the phase control region.

Figure 3B:
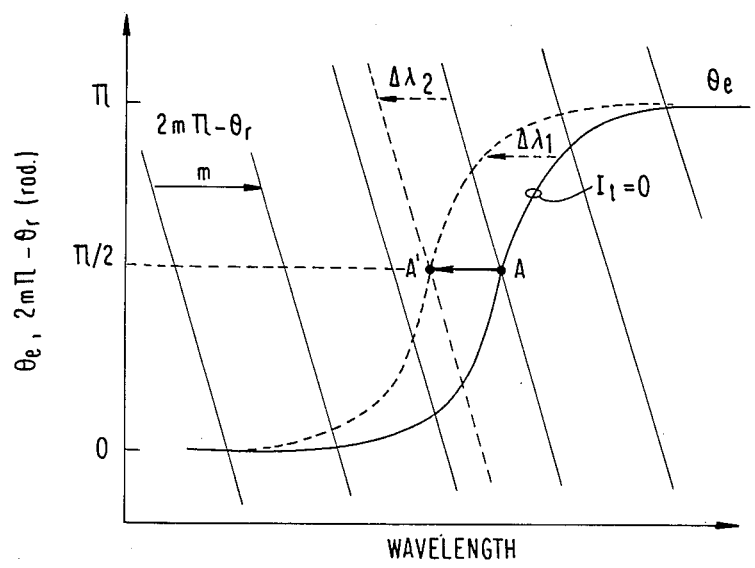
FIG. 3B is a plot for demonstrating the principle of operation of the present invention and showing a relationship between wavelengths and phases $\theta_l$ and $\theta_\gamma$.

FIG. 3B shows the principle of operation of the present invention for continuous wavelength tuning. Continuous wavelength tuning is attainable while maintaining mode A oscillation, by shifting the $\theta_l$ and $(2m\pi - \theta_\gamma)$ phase curves in parallel by a same amount toward shorter wavelength such that the phase $\theta_l$ of the mode A constantly remains at $\pi/2$. It follows that continuous wavelength tuning will be enabled if a tuning current and a phase control current are injected at the same time to equalize the amounts of shift of the $\theta_l$ and $\theta_\gamma$.

DETAILED DESCRIPTION OF THE PREFERRED EMBODIMENT

Figure 1:
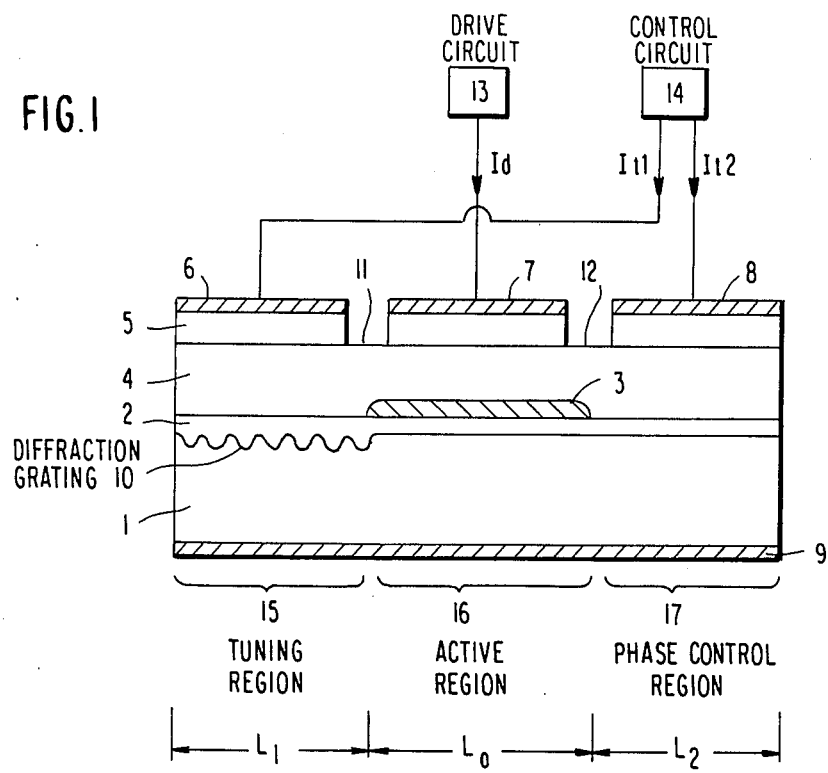
FIG. 1 is a section of a semiconductor laser device embodying the present invention.

Referring to FIG. 1, a semiconductor laser device in accordance with the present invention is shown and includes an n-InP substrate 1. The n-InP substrate 1 is provided with a diffraction grating 10 in a part thereof which corresponds to a tuning region 15, the diffraction grating 10 having a period of 2400 Å. An n-InGaAsP guide layer 2 having a 1.3 μm wavelength composition and an active layer 3 having a 1.55 μm wavelength composition are sequentially grown by epitaxy on the entire surface of the substrate 1 inclusive of the diffraction grating 10. Then, the active layer 3 is removed except for a part thereof which covers a particular region which will serve as an active region 16. A phase control region 17 is provided at the other end of the laser remote from the tuning region 15. Thereafter, a p-InP cladding layer 4 and a p+-InGaAsP cap layer 5 are sequentially grown by epitaxy over the entire surface of the multi-layers semiconductor. This is followed by providing a tuning electrode 6, an active electrode 7 and a phase control electrode 8 in their associated regions 15, 16 and 17, respectively. Grooves 11 and 12 each being deeper than the cap layer 5 intervene respectively between the electrodes 6 and 7 and between the electrodes 7 and 8 in order to set up sufficient electrical isolation. An n-electrode 9 is provided on the underside of the substrate 1. An electric circuit 13 is connected to the active electrode 7 of the subject laser to inject a drive current $I_d$ for driving the laser. Connected to the tuning electrode 6 and phase control electrode 8 is an electric circuit 14 which is adapted to inject a tuning current $I_{t1}$ and a phase control current $I_{t2}$ at the same time in such a manner that their ratio $I_{t1}/I_{t2}$ remains constant.

In the semiconductor laser device constructed as described above, the laser oscillates with a single longitudinal mode around the wavelength of 1.55 μm when the drive current $I_d$ is injected into the active region 16. For continuous wavelength tuning, it is necessary that the phase curves of $\theta_l$ and $\theta_\gamma$ shown in FIG. 3B be shifted by a same amount toward shorter wavelength responsive to the currents $I_{t1}$ and $I_{t2}$, thereby causing the mode at the crossing point A to constantly maintain $\theta_l = \pi/2$. The amount of horizontal shift of the phase curve $\theta_l$, $\Delta\lambda_1$, is equal to the amount of shift of the Bragg wavelength and, by using an effective refractive index $n_1$ and a refractive index variation $\Delta n_1$ of the tuning region 15, is expressed as:

$$\Delta\lambda_1 = (\Delta n_1/n_1)\lambda_0 \qquad \text{Eq. (1)}$$

where $\lambda_0$ is the oscillation wavelength before injection of the current $I_{t1}$.

Meanwhile, the amount of shift $\Delta\lambda_2$ of the phase curve of $(2m\pi - 2\beta L)$ is produced by:

$$\Delta\lambda_2 = \frac{\Delta n_2 L_2}{n_a L_a + n_2 L_2} \lambda_0 \qquad \text{Eq. (2)}$$

where $L_a$ and $N_a$ are, respectively, the length and refractive index of the active region 16, $L_2$ and $N_2$ are respectively the length and refractive index of the phase control region 17, and $\Delta N_2$ represents the refractive index variation of the phase control region 17.

From the above, it follows that $\Delta\lambda_1$ and $\Delta\lambda_2$ become equal to each other under the following condition:

$$\frac{\Delta n_1}{n_1} = \frac{\Delta n_2 L_2}{n_a L_a + n_2 L_2} \quad \text{Eq. (3)}$$

Assuming that the effective refractive indices of the respective regions are substantially the same ($n_1 = n_2 = n_a$), the Eq. (3) may be written as:

$$\Delta n_1 = \frac{L_2}{L_a + L_2} \Delta n_2 \quad \text{Eq. (4)}$$

Further, since the refractive index variation due to current injection is proportional to the square root of an injection current density, the Eq. (4) may be method as:

$$\sqrt{\frac{I_{t1}}{L_1}} = \frac{L_2}{L_a + L_2} \cdot \sqrt{\frac{I_{t2}}{L_2}} \quad \text{Eq. (5)}$$

where $L_1$ is the length of the tuning region 15.

As seen from the above, the prerequisite for continuous tuning is that the currents, $I_{t1}$ and $I_{t2}$ be injected in such a manner as to satisfy the following condition:

$$\frac{I_{t1}}{I_{t2}} = \left(\frac{L_2}{L_a + L_2}\right)^2 \cdot \frac{L_1}{L_2} \quad \text{Eq. (6)}$$

It will be understood from the above description that the semiconductor laser device in accordance with the present invention is tunable in a continuous fashion by injecting control currents $I_{t1}$ and $I_{t2}$ respectively into the tuning region 15 and the phase control region 17 such that the Eq. (6) is fulfilled.

Experiments showed that the semiconductor laser device of the present invention realizes continuous wavelength tuning of about 40 Å at the wavelength band of 1.55 μm. Also, a light output as great as about 5 mW was achieved which promotes the application of the device as a local oscillation light source of an optical heterodyne system.

While the present invention has been shown and described in relation to a semiconductor laser device which oscillates with a wavelength of 1.55 μm, the lasing wavelength is not limited thereto. For example, a tunable semiconductor laser device which oscillates with the wavelength of 1.3 μm may be provided by selecting a 1.2 μm wavelength composition for the guide layer 2 and a period of 2000 Å for the diffraction grating 10.

The guide layer 2 which is positioned below the active layer 3 in the illustrative embodiment may alternatively be provided above the active layer 3, in which case the diffraction grating 10 will be provided between the guide layer 2 and the cladding layer 4. In addition, a thin InP layer may be formed between the guide layer 2 and the active layer 3.

Although the active region 16 in the illustrative embodiment is located at the center of the laser, the respective regions may be arranged in any other suitable configuration such as with the phase control region 17 located at the center, as shown in FIG. 4.

In the illustrative embodiment, the active layer 3 is removed in the tuning region 15 and phase control region 17. If desired, however, the active layer 3 may be left in all the three regions.

While the means for enhancing electrical isolation between electrodes are implemented by the grooves 11 and 12 which are deeper than the cap layer 5, it may alternatively be implemented with, for example, implantation of protons between the electrodes. The semiconductor applicable to the present invention is not limited to InGaAsP/InP and may be replaced with AlGaAs/GaAs, for example. Further, the ratio of the control currents $I_{t1}$ and $I_{t2}$ does not always have to satisfy the Eq. (3) and needs only to be close to a condition which fulfills the Eq. (6).

In summary, it will be seen that the present invention provides a semiconductor laser device which wavelength is tunable in a continuous manner. The device, therefore, implements not only a local oscillator for an optical heterodyne system but a wide range of other light sources utilizing its inherent tunability, such as a light source for frequency modulation schemes, a light source for transmission in a frequency shift keying (FSK) heterodyne system which belongs to a family of optical heterodyne systems, and a light source for wavelength multiplex transmission.

What is claimed is:

1. A wavelength tunable semiconductor laser device comprising:
    a multi-layer semiconductor structure including an active region which includes an active layer for emitting light responsive to stimulation, a first control region including a guide layer for guiding light which is being propagated, and a second control region including a guide layer provided with a diffraction grating for guiding light which is being propagated, said active region, first control region and second control region being arranged in such a manner that said active region is located between said first and second control regions in a row along an axis of resonance and is optically connected to said first and second control regions;
    an active electrode adapted to inject current into the active region;
    a resonant cavity established by said diffraction grating and a portion of said first control region;
    a first control electrode and a second control electrode adapted to inject currents, respectively, into the first and second control regions;
    means for applying a drive current to said active electrode; and
    means for applying control currents to the first and second control electrodes in a predetermined ratio.

2. A multi-layer semiconductor, adapted to act as a laser which has its wavelength response tunable in a continuous manner, comprising:
    a first electrode layer defining one side of said semiconductor;
    an active layer for emitting light in response to electrical stimulation;
    a guide layer for guiding said emitted light during its propagation through the semiconductor, said guide layer having disposed thereon a diffraction means;

a base substrate layer having located on a first side thereof said first electrode layer and on a second side thereof said active layer and said guide layer;

said semiconductor having an axis of resonance and being divided along said axis into a first region, a second region and a third region;

a second electrode layer defining a second side of said semiconductor, said layer comprising a first control electrode adapted to inject a first current into said first region of said semiconductor, a second control electrode adapted to inject a second current into said second region of said semiconductor, an active electrode adapted to inject a third current into said third region of said semiconductor, each of said electrodes in the electrode layer being electrically isolated from each other.

3. The semiconductor laser device as claimed in claim 2, wherein said guide layer is positioned between the active layer and the electrode layer within said third region of said semiconductor, said third region being an active region.

4. The semiconductor laser device as claimed in claim 2, wherein said active layer is positioned between the guide layer and the electrode layer within said third region of said semiconductor, said third region being an active region.

5. The semiconductor laser device as claimed in claim 2, wherein said third region, first region and second region comprise, respectively, an active region, first control region and second control region arranged along a linear axis of resonance.

6. The semiconductor laser device as claimed in claim 3, wherein a InP layer is formed between said guide layer and said active layer.

7. The semiconductor laser device as claimed in claim 3, wherein the ratio of the control current to the first electrode ($It_1$) and the control current to the second electrode ($It_2$) satisfy the equation:

$$\frac{It_1}{It_2} = \frac{L_2}{L_a + L_2} 2 \cdot \frac{L_1}{L_2}$$

$L_1$ is the length of the first region,
$L_a$ is the length of the active region and
$L_2$ is the length of the second region.

8. The semiconductor laser device as claimed in claim 1, wherein said diffraction means has a predetermined period and said guide layer has a predetermined wavelength composition and the wavelength of said semiconductor laser is a function of said wavelength composition of the guide layer and said period for the diffraction means.

9. The semiconductor laser device as claimed in claim 2, wherein said diffraction means is a grating having a period defined to correspond to the desired wavelength of said semiconductor.

10. The semiconductor laser device as claimed in claim 2, wherein said first current and said second current are present in a predetermined ratio and said first region and said second region are adapted to concurrently receive said currents at a predetermined ratio, whereby shifts in the phase of light returned from the first region and the third region due to reflections are equalized.

11. A wavelength tunable semiconductor laser device comprising:

a multi-layer semiconductor structure including an active region which includes an active layer for emitting light responsive to stimulation, a first control region including a guide layer for guiding light which is being propagated, and a second control region including a guide layer provided with a diffraction grating for guiding light which is being propagated, said active region, first control region and second control region being arranged in such a manner that said first control region is located between said active region and said second control region in a row along an axis of resonance, and optically connected to said active and second control regions;

an active electrode adapted to inject a current into the active region;

a first control electrode and a second control electrode adapted to inject currents, respectively, into the first and second control regions;

a resonant cavity established between said diffraction grating and a portion of said active region;

means for applying a drive current to said active electrode; and means for applying control currents to the first and second control electrodes in a predetermined ratio.

12. A wavelength tunable semiconductor laser device comprising:

an active region for emitting light in response to an injection current, said active region including a semiconductor active layer and first electrode means for supplying said injection current to said active regions;

a first control region optically connected to said active region for feeding back said light having specific wavelengths to said active region, said first control region being tunable in said specific wavelengths by changing a tuning current, said first control region including a diffraction grating made of semiconductor material and second electrode means for supplying said tuning current to said first control region;

a second control region, optically connected to said active region and located opposite said first control region, for controlling the phase of light travelling therein by changing a phase control current, said second control region including an end facet remote from said active region and third electrode means for supplying said phase control current to said second control region; and resonant cavity means established, together with said active region, between said first control region and said end facet of said second control region;

wherein said first control region, active region and second control region are formed on a common substrate.

13. The wavelength tunable semiconductor laser device as set forth in claim 12, said laser device further comprising means for applying said tuning current and said phase control current in a predetermined ratio.

14. A wavelength tunable semiconductor laser device comprising:

an active region for emitting light in response to an injection current, said active region including an semiconductor active layer and first electrode means for supplying said injection current to said active region;

a first control region optically connected to said active region and integral to the first end of said active region for controlling the phase of light travelling therein by changing a phase control current, said first control region including second electrode means for supplying said phase control current to said first control region;

a second control region, optically connected to said first control region and positioned integral with the opposite end of said active region, for feeding back said light having specific wavelengths to said active region through said second control region, said second control region being tunable in said specific wavelengths by changing a tuning current, said second control region including a diffraction grating made of semiconductor material and third electrode means for supplying said tuning current to said second control region; and resonant cavity means established, together with said first control region, between said second control region and a portion of said active region;

wherein said first control region, second control region and active regions are formed on a common substrate.

15. The wavelength tunable semiconductor laser device as set forth in claim 14, said laser device further comprising means for applying said tuning current and said phase control current in a predetermined ratio.

* * * * *